United States Patent [19]

Knepper et al.

[11] Patent Number: 5,146,661
[45] Date of Patent: Sep. 15, 1992

[54] PACKAGED DEVICE HANDLING METHOD AND APPARATUS

[75] Inventors: Jonathan D. Knepper, Salisbury Township, Lehigh County; Gerald J. Masavage, Macungie; Phillip A. Solomon, Fleetwood, all of Pa.

[73] Assignee: AT&T Bell Laboratories, Murray Hill, N.J.

[21] Appl. No.: 610,369

[22] Filed: Nov. 7, 1990

[51] Int. Cl.[5] ............................................. H01L 21/58
[52] U.S. Cl. .................... 29/25.01; 29/743; 29/759; 29/740; 29/787; 29/786; 29/831; 228/6.2
[58] Field of Search ............... 437/209; 29/25.01, 743, 29/759, 739–741, 787, 771, 831, 786; 414/627; 228/6.1, 6.2

[56] References Cited

U.S. PATENT DOCUMENTS

| 4,479,298 | 10/1984 | Hug | 29/759 |
|---|---|---|---|
| 4,535,887 | 8/1985 | Egawa | 206/328 |
| 4,567,652 | 2/1986 | Gussman et al. | 29/837 |
| 4,584,764 | 4/1986 | Gussman | 29/705 |
| 4,684,182 | 8/1987 | Gussman | 439/68 |
| 4,749,329 | 6/1988 | Stout | 414/627 |
| 4,817,273 | 4/1989 | Lape et al. | 29/741 |

FOREIGN PATENT DOCUMENTS

| 3235139 | 9/1982 | Fed. Rep. of Germany | 437/209 |
|---|---|---|---|
| 57-076850 | 5/1982 | Japan | 437/209 |
| 61-027645 | 2/1986 | Japan | 437/209 |
| 64-030235 | 2/1989 | Japan | 437/209 |
| 1-039032 | 2/1989 | Japan . | |
| 2-036550 | 2/1990 | Japan | 437/209 |
| 2-095621 | 4/1990 | Japan . | |
| 2-222155 | 9/1990 | Japan . | |

Primary Examiner—Olik Chaudhuri
Assistant Examiner—Andrew Griffis
Attorney, Agent, or Firm—J. T. Rehberg

[57] ABSTRACT

An apparatus and method for loading integrated circuit packages into package carriers is disclosed. Featured is a pick-and-place mechanism mounted on a tiltable table. Packages and carriers slide toward the pick-and-place mechanism under the influence of gravity. The pick-and-place mechanism combines the packages with carriers. The package/carrier combinations then slide away from the pick-and-place mechanism.

4 Claims, 6 Drawing Sheets

PACKAGED DEVICE HANDLING METHOD AND APPARATUS

TECHNICAL FIELD

In the manufacture of assemblies including integrated circuit devices, this invention is concerned with the production and testing of packaged devices.

BACKGROUND OF THE INVENTION

As a part of the manufacturing process, integrated circuits typically undergo a variety of functional tests. Many packages are subjected to testing under extreme operating conditions, such as burn-in testing. Many modern integrated circuit packages have a multiplicity of leads which are fragile and easily bent or broken. Consequently, packages are frequently enclosed in protective package carriers which protect the package leads while facilitating external electrical connection to these leads. Package carriers are frequently loaded into shipping slides or containers called "core sticks" for transportation between test stations.

The placement of packages into package carriers and package carriers into core sticks is a time-consuming, labor-intensive process. Great care is frequently required during the placement of the packages into the package carriers to prevent the breaking or bending of closely spaced leads.

SUMMARY OF THE INVENTION

An illustrative embodiment of the present invention is a method for providing a plurality of packaged devices ready for testing including:

gravity feeding a device package and a device package carrier to the pick-and-place means;

activating the pick-and-place means to combine the device package with the device package carrier, thereby forming an assembly; and conveying the resulting assembly away from the pick-and-place means by gravity.

The process is illustratively performed by an automated pick-and-place apparatus mounted on a tiltable table, thus eliminating the need for substantial manual labor and helping to insure protection of delicate package leads.

An alternative embodiment of the present invention includes an apparatus for combining integrated circuit device packages with carriers including a support means for packages, carriers and package-carrier combinations, the support means being capable of tilting from the horizontal. The apparatus further includes a pick-and-place means, means for releasing packages and carriers to the pick-and-place means, and means for conveying package-carrier combinations away from the pick-and-place means.

DETAILED DESCRIPTION

Figure 1:
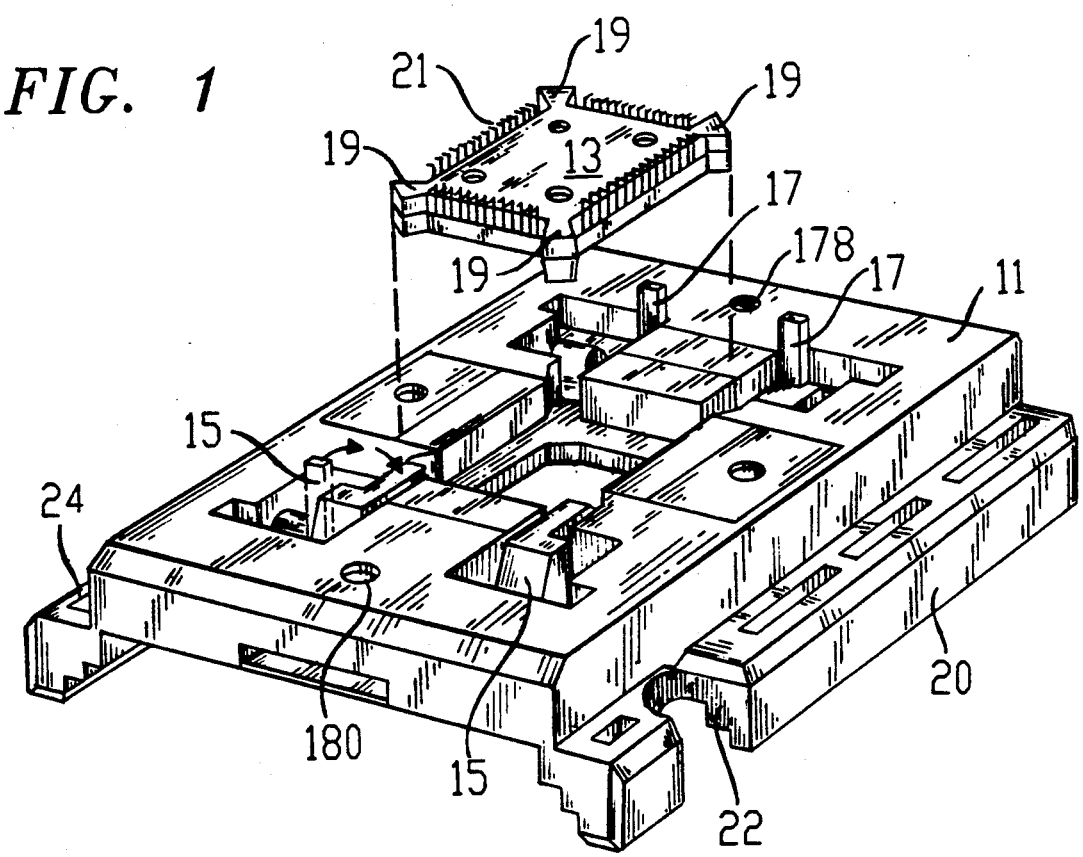
FIG. 1 is a schematic perspective representation of an exemplary package carrier into which an integrated circuit package may be inserted.

FIG. 1 illustrates a carrier 11 adapted to hold and protectively enclose package 13. Hinged latch 17, depicted in the "up" position serves to engage and cover a pair of protrusions 19, thus securing package 13 within carrier 11. Corresponding latch 15 is illustrated in the "down" position. During package loading, latch 15 would be moved to the "up" position, the package inserted, and then latch 15 moved to the "down" position to secure package 13. An example of package carrier 11 is provided by U.S. Pat. No. 4,535,887 issued to Egawa and entitled "Integrated Circuit Package Carrier" and incorporated herein by reference. Package 13 is illustrated as a plastic quad flat pack (PQFP). Typically, a PQFP has 21, 25, or 36 leads per side, corresponding to respective total numbers of 84, 100, and 132 electrical input/output leads. When package 13 has been inserted and latched within package carrier 11, the combination (i.e., the loaded carrier) may be handled without fear of damage to delicate leads 21 on package 13.

Figure 2:
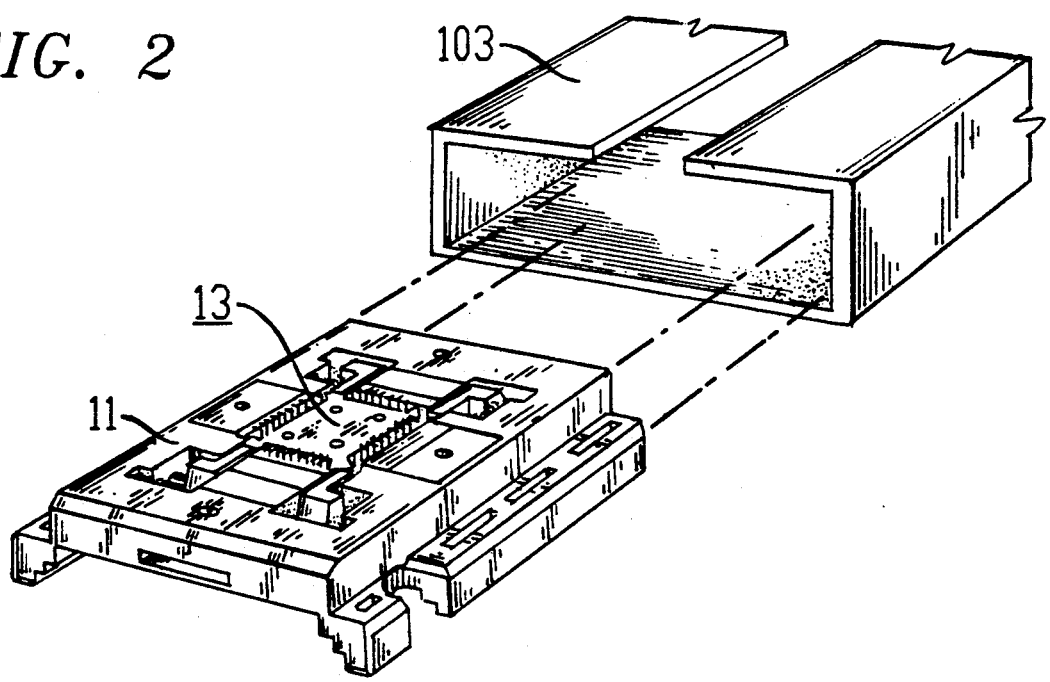
FIG. 2 is a schematic perspective representation of an exemplary core stick, dimensioned to hold loaded package carriers.

FIG. 2 illustrates how package carriers 11 containing packages 13 may be loaded into core sticks 103 for transportation between testing stations or for shipment. As will be noted further below, core sticks akin to that depicted in FIG. 2 are also provided for packages, such as package 13, which are not enclosed in package carriers such as carrier 11. Of course, core sticks designed to hold packages without carriers are dimensioned somewhat smaller than core sticks such as core stick 103 depicted in FIG. 2 which is intended to hold integrated circuit packages.

An illustrative embodiment of the present invention is directed toward a method and apparatus for the automatic insertion of packages 13 into package carriers 11 and the automatic insertion of loaded package carriers 11 into core sticks 103. Another aspect of the present invention includes the automatic removal of loaded package carriers 11 from core sticks 103 and the subsequent removal of packages 13 from package carriers 11. In the past these processes have been performed manually, thus consuming considerable expense and time.

Figure 3:
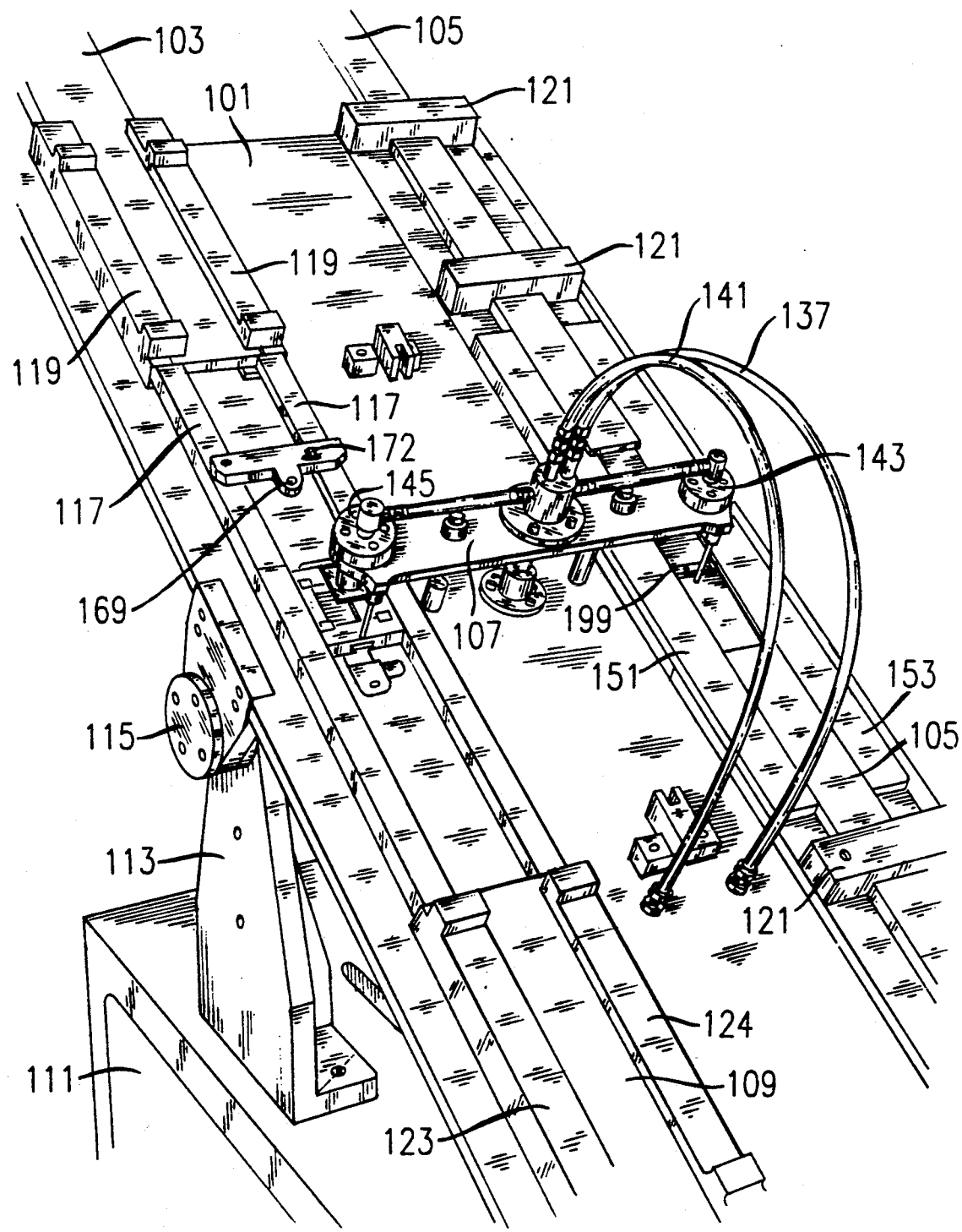
FIG. 3 is a schematic perspective representation of an apparatus in accordance with an illustrative embodiment of the invention.

FIG. 3 is an overall perspective view of an illustrative embodiment of the inventive device. Table 101 is tilted by an actuator (not shown). Two parallel core sticks 103 and 105 are positioned at the upper end of table 101. Core stick 103 contains a plurality of empty package carriers 11 akin to that depicted in FIG. 1. Core stick 105 contains a plurality of integrated circuit packages akin to package 13 depicted in FIG. 1. It is desired to place the integrated circuit packages in core stick 105 within the package carriers 11 contained in core stick 103.

Both packages and carriers slide downward under the influence of gravity until they encounter a pick-and-place mechanism 107. Mechanism 107, to be described in greater detail below, picks up each package and loads it into a respective package carrier. Loaded package carriers slide into an empty core stick 109 for subsequent removal to testing or shipping stations. (The invented device is also capable of performing the reverse function, i.e., removing packages from package carriers and putting both packages and package carriers into separate core slides.)

Continuing with FIG. 3, reference numeral 111 denotes a central processor unit and an electromechanical/pneumatic control unit which direct and power the pick-and-place mechanism and also tilt table 101. Table support 113 bolted atop control unit 111 supports hinge 115. Table 101 pivots upon hinge 115 so that the forces of gravity may be utilized to direct both packages and package carriers toward pick-and-place mechanism 107. Table 101 is tilted, as mentioned before, by an actuator not shown, to an angle Θ of approximately 40°. Guide rails 117 and 119 serve to hold and stabilize core stick 103 which contains, as mentioned before, empty package carriers. Similarly, core stick 105 is secured by guides 121 and guide rails 151 and 153. Guide rails 123 and 124 serves to hold core stick 109.

Figure 4:
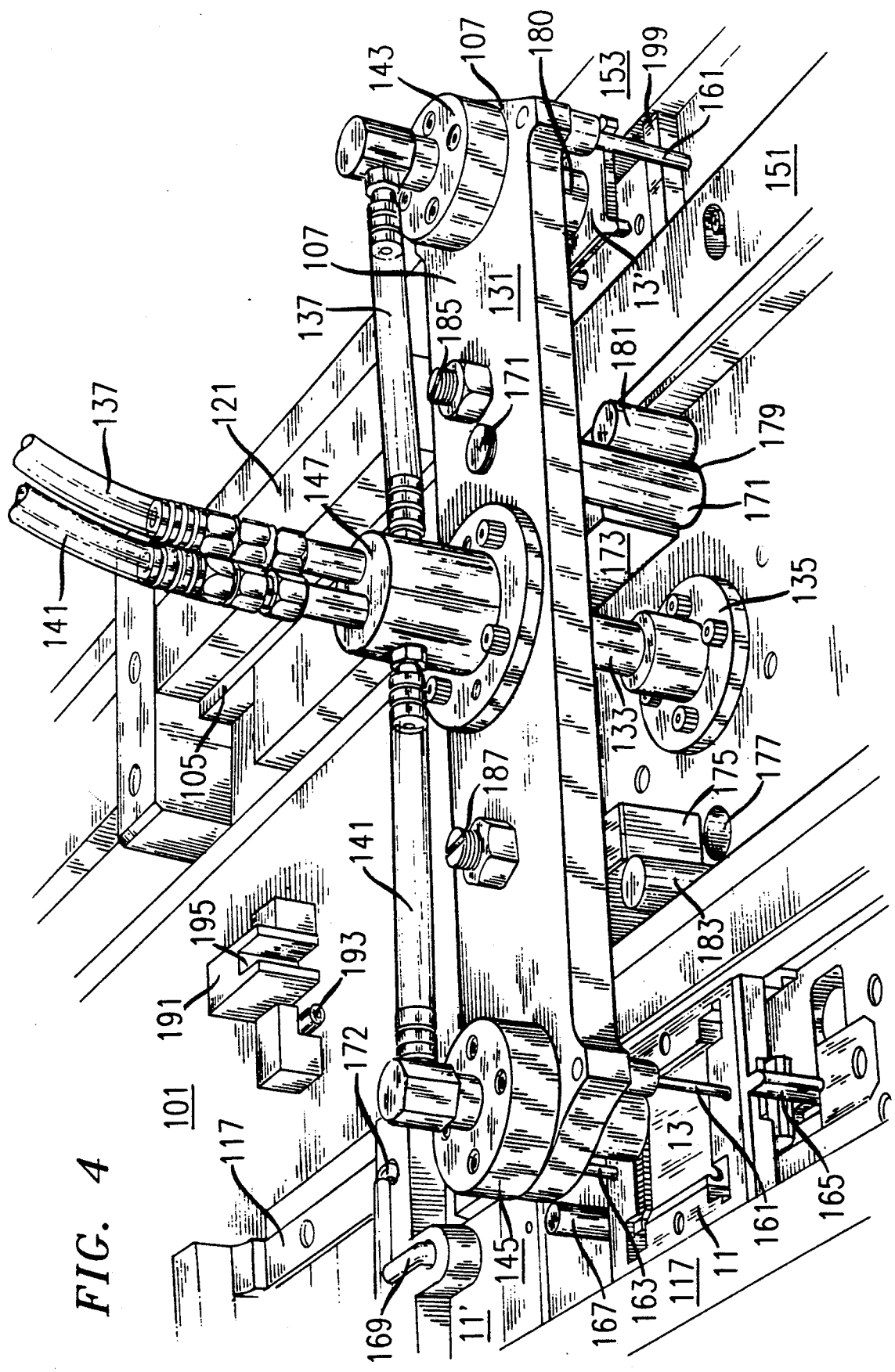
FIG. 4 is a schematic perspective representation of a portion of the apparatus depicted in FIG. 3.

Turning to FIG. 4, there are depicted the details of pick-and-place mechanism 107. Bar 131 is supported by shaft 133 which is surrounded by retaining collar 135. Bar 131 serves as a rotary arm for picking up integrated circuit packages and placing them within respective package carriers. Bar 131 will henceforth be termed a "rotary arm." Shaft 133 is connected to electromechanical apparatus beneath table 101 which is capable of lifting and rotating rotary arm 131. Flexible vacuum lines 137 and 141 are connected to collar 147, whence they provide suction power (via an appropriate vacuum pump under the control of unit 111) to vacuum chucks 143 and 145, respectively.

In FIG. 4, package 13 has just been deposited by vacuum chuck 145 into carrier 11 held between guide rails 117. In addition, vacuum chuck 143 is picking up package 13' in preparation for its 180° rotation and insertion into the next available package carrier.

More details of the placement operation will be provided in subsequent paragraphs. However, while reviewing FIG. 4, it is convenient to note that reference numerals 161 and 163 are latch opening pins attached to rotary arm 131. Pins 161 and 163 serve to open latches 17 and 15 (FIG. 1) (by extending through openings 179 and 177 of carrier 11) so that integrated circuit package 13 may be inserted within package carrier 11.

Escapement pin 165 extends vertically upward from the surface of table 101 and serves to hold carrier 11 (and prevent it from sliding downward under the influence of gravity) as package 13 is placed therein. (Next latches 15 and 17 are closed by apparatus to be described in following paragraphs). After the placement and latch-closing operations are completed and rotary arm 131 has disengaged, escapement pin 165 lowers beneath the surface of table 101, permitting loaded package carrier 11 to slide downward into core stick 109 (FIG. 3).

It will also be noted that FIG. 4 depicts a second (unloaded) package carrier 11' abutting second escapement pin 167. Package carrier 11' will eventually receive package 13' now held in vacuum chuck 143. Meanwhile, escapement pin 167 prevents package carrier 11' from sliding forward and interfering with the loading of package carrier 11. The presence of package carrier 11' is detected by photocell 169. Should photocell 169 fail to detect the presence of a package carrier, the central processing unit 111 will conclude that all available package carriers have been filled and that the loading operation may be terminated (and table 101 returned to horizontal).

As mentioned before, rotary arm 131 with vacuum chuck 143 picks up a package, then rises upward from the surface of table 101, and rotates, positioning the package above a waiting package carrier secured between guide rails 117. The rising of rotary arm 131 is caused by rising (i.e., upward sliding) of shaft 133 through retaining collar 135. After rotation, rotary arm 131 descends (i.e., shaft 133 descends downward) vacuum is removed from vacuum chuck 143, and package 13 is deposited within carrier 11.

A variety of stops and guides are provided to insure that rotary arm 131 accurately positions packages into carriers. For example, pin 171 depends from rotary arm 131. In FIG. 4, pin 171 abuts stop block 173 which is secured to table surface 101. When rotary arm 131 rotates 180°, pin 171 abuts stop block 175 which is also secured to table 101. Thus, arm 131 accurately stops above waiting carriers. As rotary arm 131 descends to place a package within a carrier, pin 171 descends within hole 177. Thus, the presence of pin 171 and blocks 173 and 175 insure that rotary arm 131 rotates between two fixed, accurately predetermined positions. (In FIG. 4, since rotary arm 131 has not completely risen, pin 171 protrudes slightly into hole 179.) Stop block 199 helps to accurately locate package 13' while it is being picked up by vacuum chuck 143.

As mentioned before, rotary arm 131 descends to pick up a package, rises to rotate the package into position above a carrier and then descends to place the package within the carrier. It is important that the descent of rotary arm 131 be precisely controlled so that rotary arm 131 does not, for example, descend too far, thus causing damage to the packages or carriers. Adjusting screws 185 and 187 are positioned upon rotary arm 131. Both screws 185 and 187 protrude downward, although the downward protrusion is not shown in the figure. Stop blocks 181 and 183 contact the downward protrusions of adjusting screws 185 and 187. Thus, downward movement of rotary arm 131 is arrested when one of the bolts 185, 187 strikes one of the stop pins 181 or 183. It will be noted that bolts 185 and 187 are adjustable, thus facilitating use of the inventive apparatus with various sizes of packages and carriers.

Block 191 has groove 195 which admits a tang (not shown) for a safety cover (not shown). Photodetector 193 helps to determine whether the cover is in place and prevents operation of the unit until the safety cover has been put in place.

Figure 5:
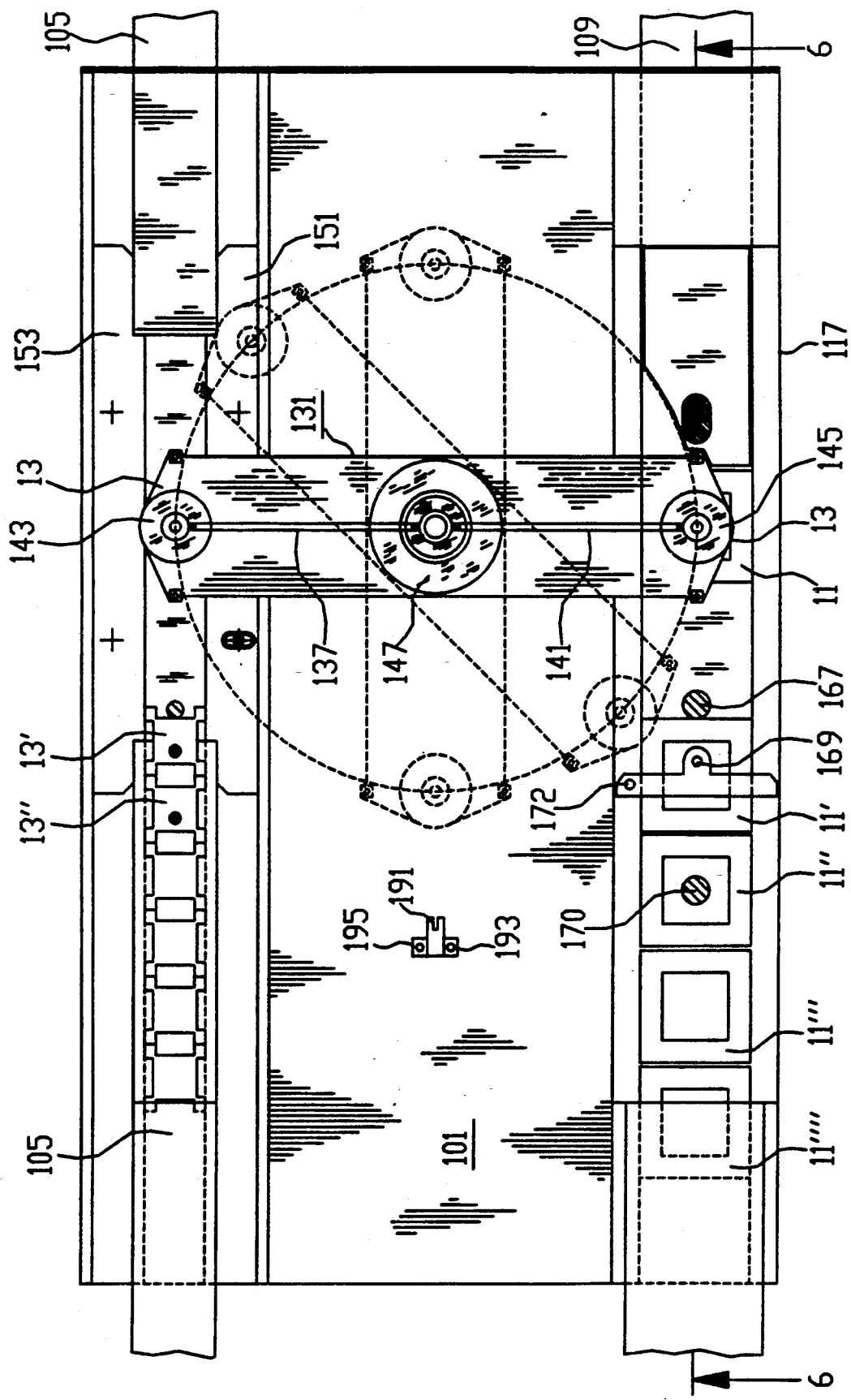
FIG. 5 is a plan view of a portion of the apparatus illustrated in FIG. 3.

The next few paragraphs will describe in more detail how packages are placed in and secured within carriers. FIG. 5, a plan view of an illustrative embodiment of the inventive device, shows package 13 being placed within carrier 11 via rotary arm 131. Carriers 11', 11" and 11''' are empty, awaiting loading. Package 13' is scheduled to be loaded within carrier 11'; package 13" is scheduled for loading into carrier 11", etc.

It will be noted, from FIG. 3 that both carriers and packages slide towards rotary arm 131 under the influence of gravity. Various actuators positioned beneath table 101 serve to activate escapement pins which hold carriers and packages in queue as they await interaction with rotary arm 131. For example, turning to FIG. 6, escapement pin 165 prevents carrier 11 from sliding forward while it is being loaded with package 13. Meanwhile, pin 167 serves to hold carrier 11', together with carriers behind carrier 11' (such as carrier 11" and 11''')

from sliding forward and interfering with the placement of package 13 within carrier 11.

After package 13 has been loaded and secured within carrier 11, pin 165 is withdrawn under the control of actuator 171, governed by the microprocessor 111 below the surface of table 101, permitting the loaded package carrier to slide downward into core stick 109 (FIG. 3). Then pin 170 is pushed upward via actuator 175. Pin 170 engages the open center of carrier 11″. Next, pin 167 is withdrawn beneath the surface of table 101 via actuator 173, permitting carrier 11′ to slide into position beneath rotary arm 131. Pin 165, meanwhile, has again risen above the surface of table 101, thus providing a stop against which carrier 11′ may rest as it is being loaded. A similar 2-pin-sequence controls the feeding of packages 13 to rotary arm 131.

Figure 6:
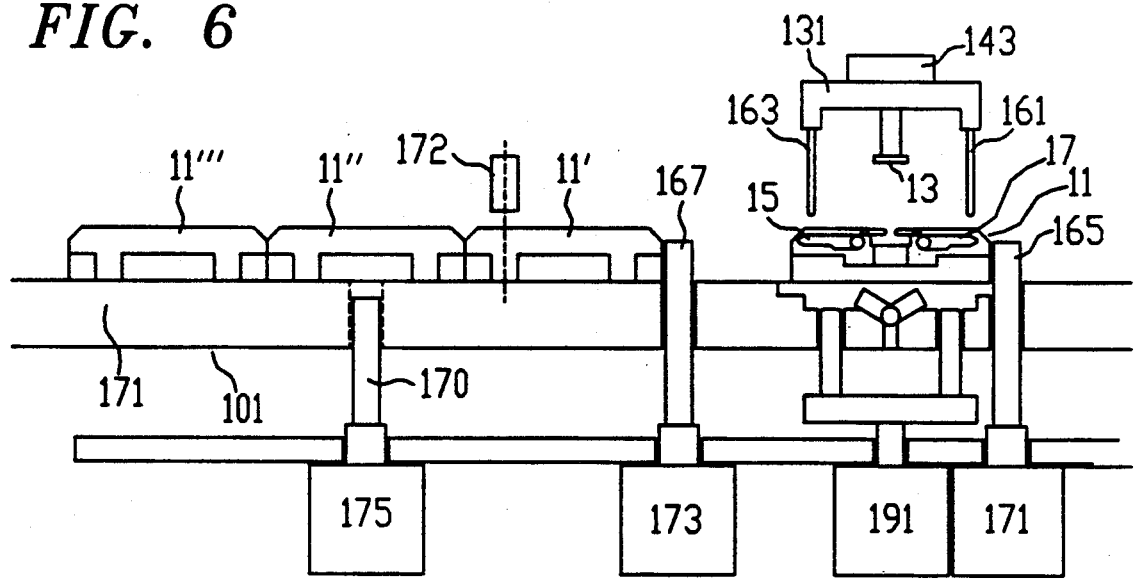
FIGS. 6–8, 9A and 9B are cross-sectional views of the apparatus depicted in FIGS. 3 and 4.
Figure 7:
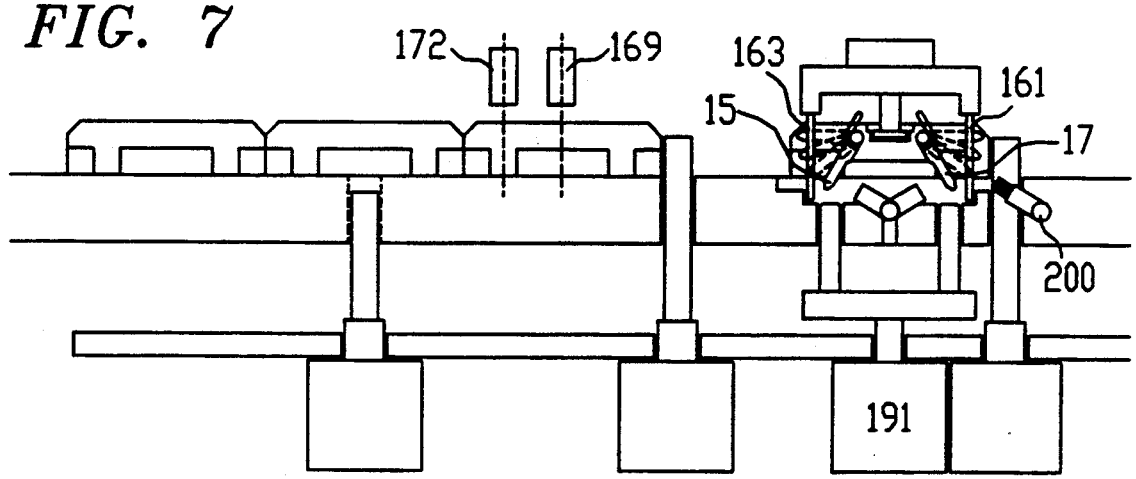
Figure 8:
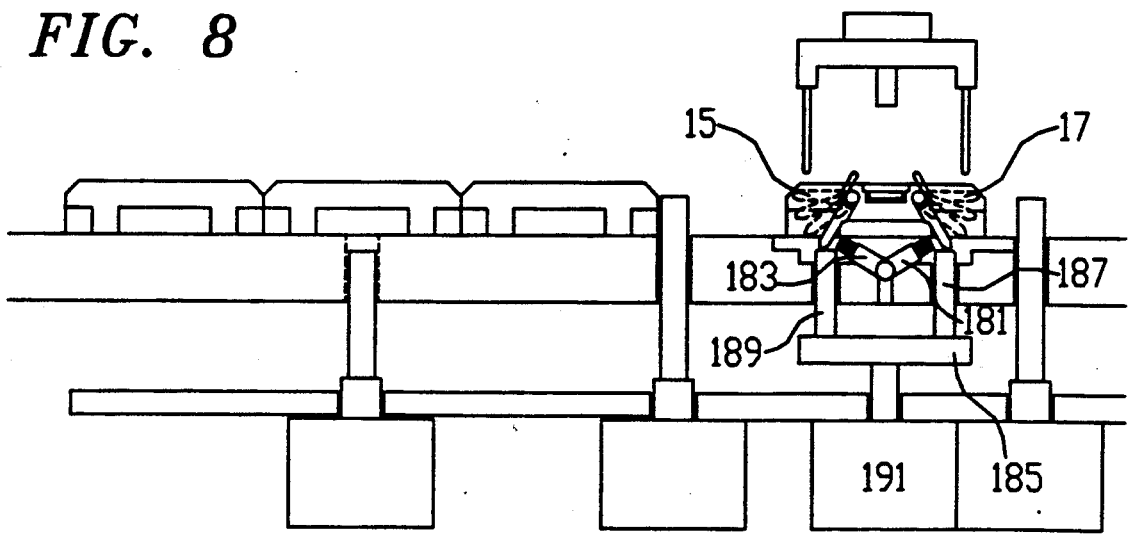
Figure 9A:
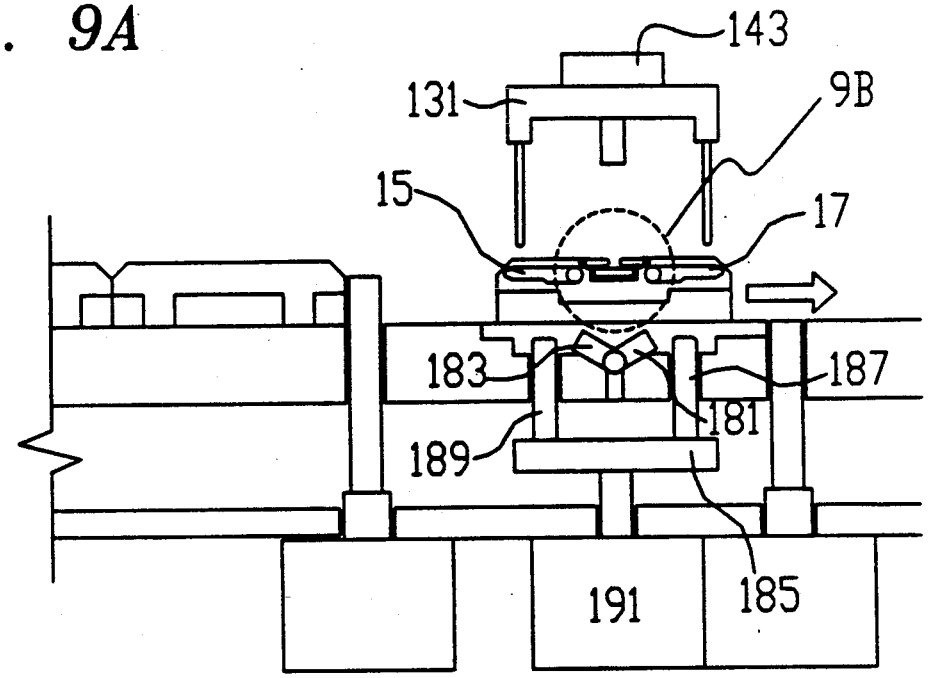
Figure 9B:
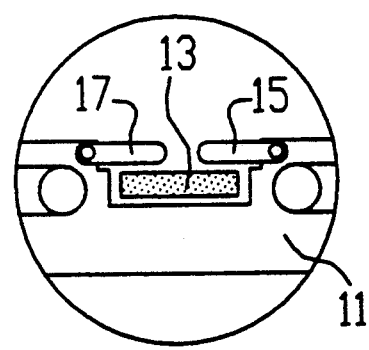

FIGS. 6–8 also show the details of placement of package 13 within carrier 11. In FIG. 6, it will be noted that package 13 is held by vacuum chuck 143. Latches 17 and 15 of carrier 11 are in the closed position. As pick-and-place rotary arm 131 descends (FIG. 7), pins 163 and 161 engage latches 17 and 15 through holes 178 and 180, (FIG. 1) respectively, thus opening both latches, facilitating insertion of package 13 within carrier 11.

Since table 101 is tilted downward (toward the right in FIGS. 6–8) there is a tendency for latch 17 to re-close under the influence of gravity before package 13 can be inserted. Air jet 200 deflects the dangling lower portion of latch 17, thus maintaining latch 17 in the open position. Air jet 200 is positioned along side pin 165.

In FIG. 6, pick-and-place rotary arm 131 first opens latches 17 and 15, and then deposits package 13 within carrier 11 by lowering and then releasing package 13 from vacuum chuck 143.

In FIG. 8, pick-and-place arm 131 has risen upwards from loaded carrier 13. Closing of latch pairs 15 and 17 is accomplished in two steps. Air jets 181 and 183 deflect portions of the downward dangling latches 17 and 15 toward the closed position. Then actuator 191 pushes plate 185 with prongs 187 and 189 upward. Actuator 191 completes the closing of latch pairs 17 and 15, thus securing package 13 within carrier 11. Now, loaded carrier 11 is ready to slide forward after pin 165 is depressed below the level of table 101, as mentioned before.

Since carriers 11 have an essentially square shape, it is possible that some carriers may have been accidentally loaded into core stick 103 in the wrong position, i.e., rotated 180°. A photodiode 172 located outside the plane of FIGS. 6–8 illuminates side 20 of carrier 11. Should there be an opening such as opening 22, light from the photodiode 172 will enter opening 22 (FIG. 1) on side 20 of carrier 11 and emerge from bottom of carrier 11 and enter top of table 101 from which it is detected by a photodetector. Should there be no opening, no light is detected by the photodetector. Thus, correct alignment of the carrier is assured.

As mentioned before, the process of loading core sticks with carriers containing packages may be reversed. That is, core sticks may be unloaded and the packages removed from the carriers by a reversal of the process just described. (Stop block 199 is removed and core stick 105 (FIG. 3) is positioned to catch packages 13.)

Figure 10:
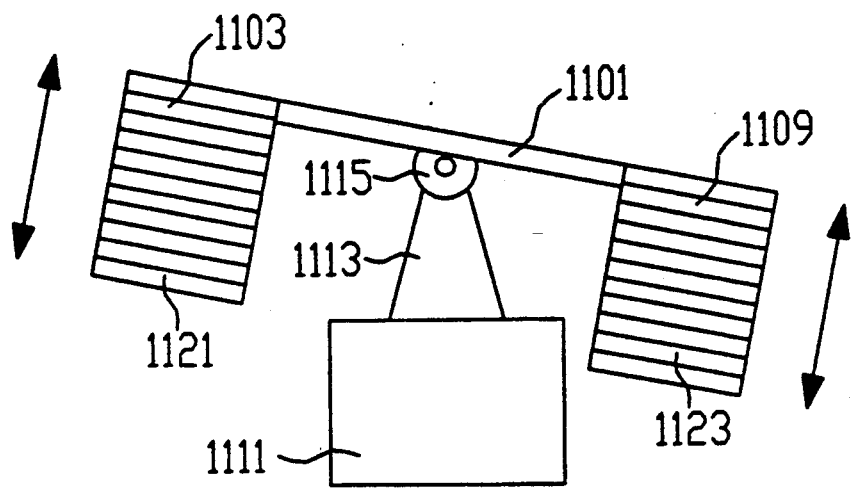
FIG. 10 is a schematic view of an alternative illustrative embodiment of the present invention.

The inventive principles embodied in the apparatus and method presented above may be extended as shown in FIG. 10. In FIG. 10 a tiltable table 1101 is mounted on hinge 1115 and support bracket 1113 atop cabinet 1111 which contains the microprocessor and controls. Racks 1121 and 1123 (and another rack not shown) contain core sticks 1103 with package carriers, empty core sticks 1109, and core sticks with packages, respectively. Each rack is raised sequentially so that the operation described above may be performed on the respective packages and carriers. Then the racks are raised again so that a new set of core sticks will be processed, etc. This embodiment permits the loading and/or unloading of a large quantity of core sticks automatically.

We claim:

1. Apparatus for combining integrated-circuit device packages with carriers, comprising:
   support means for packages, carriers, and package-carrier combinations, said support means being capable of tilting from the horizontal,
   pick-and-place means on said support means, and
   means for releasing packages and carriers whereby said packages and carriers move due to the influence of gravity to said pick-and-place means; and
   means for conveying package-carrier combinations away from said pick-and-place means.

2. The apparatus of claim 1 wherein
   said pick-and-place means includes a rotary arm having two ends;
   two vacuum chucks each located at a respective said end of said rotary arm; and
   means for controlling each of said vacuum chucks to pick up and release said packages.

3. The apparatus of claim 2 further including at least one pin connected to each end of said rotary arm in the vicinity of said vacuum chuck, said pin serving to engage a portion of said carrier before release of said package.

4. An apparatus for combining integrated circuit device packages with carriers having a pair of hinged latches for securing said packages comprising:
   a table having a top surface
   means for tilting said table;
   a slidable, rotatable shaft protruding through said top surface of said table;
   an arm attached to said shaft, said arm having two ends and an underside;
   two vacuum chucks, each located at a respective said end of said arm;
   said table having first and second guides upon its top surface, said first guide being dimensioned to hold a core stick suitable for containing package carriers, said second guide being dimensioned to hold a core stick suitable for containing integrated circuit packages;
   said table having three single prong actuators and one double prong actuator, one of said single prong actuators being positioned to hold one said carrier during combining with a said package and the other two of said single prong actuators being positioned to hold a plurality of other carrier packages in queue;
   said double prong actuator being positioned to engage said latches of said one said carrier during combining with a said package to secure said package within said carrier;
   a pair of air jets being positioned beneath said one carrier being combined with a package, said air jets being oriented to tilt said latches of said one carrier package to facilitate closing of said latches;
   a first photodetector positioned in proximity to said one carrier whereby said first photodetector is capable of determining the presence or absence of other said carriers in queue; and
   a second photodetector positioned in proximity to said first guide whereby said second photodetector is capable of determining the presence or absence of other said carriers in queue.

* * * * *